United States Patent [19]

Werking

[11] Patent Number: 4,564,953
[45] Date of Patent: Jan. 14, 1986

[54] PROGRAMMABLE TIMING SYSTEM

[75] Inventor: Paul M. Werking, Richardson, Tex.

[73] Assignee: Texas Instruments Incorporated, Dallas, Tex.

[21] Appl. No.: 479,373

[22] Filed: Mar. 28, 1983

[51] Int. Cl.[4] .................. H03K 23/66; H03K 5/13; H03K 5/04
[52] U.S. Cl. ..................... 377/52; 377/44; 328/60; 328/63; 307/269; 307/265
[58] Field of Search .............. 377/44, 39, 52; 328/60, 328/61, 63, 72; 307/265, 269

[56] References Cited

U.S. PATENT DOCUMENTS

| | | | |
|---|---|---|---|
| 3,657,658 | 4/1972 | Kubo | 328/61 |
| 3,870,963 | 3/1975 | Groce et al. | 377/39 |
| 4,017,719 | 4/1977 | Kaplan et al. | 377/44 |
| 4,084,082 | 4/1978 | Alfke | 377/52 |
| 4,184,068 | 1/1980 | Washburn | 377/44 |
| 4,231,104 | 10/1980 | St. Clair | 364/900 |
| 4,238,825 | 12/1980 | Geery | 377/50 |
| 4,310,801 | 1/1982 | Baker | 328/48 |
| 4,330,751 | 5/1982 | Swain | 307/265 |
| 4,365,202 | 12/1982 | Sinniger | 377/39 |

OTHER PUBLICATIONS

"Sink Your Teeth Into a SAW", by Tom Shoquist, May 1979, Electronic Products Magazine.
"SAW Components Answer Today's Signal-Processing Needs", by R. J. Murray and P. D. White, Electronics, Sep. 8, 1981.

Primary Examiner—Stanley D. Miller
Assistant Examiner—Richard Roseen
Attorney, Agent, or Firm—Richard A. Bachand; N. Rhys Merrett; Melvin Sharp

[57] ABSTRACT

A programmable high resolution timing system includes a selectable modulus prescaler counter. In one embodiment a high frequency clock is coupled to a prescaler counter which provides an output signal every predetermined number of clock pulses. The prescaler is coupled to a period counter which provides a period signal after a predetermined number of prescaler output signal pulses. The prescaler and period counter are coupled to a memory which stores data corresponding to the selected modulus of the prescaler and the number of counts by which the period counter output signal is to be delayed. The period resolution is thus made substantially equal to the resolution of the high frequency clock by varying the prescaler modulus at programmable intervals.

3 Claims, 4 Drawing Figures

PROGRAMMABLE TIMING SYSTEM

BACKGROUND OF THE INVENTION

The present invention relates generally to systems for generating timing signals, and more particularly to a programmable, high resolution timing system including selectable modulus counting means.

Various systems have been used to generate a sequence of timing signals of variable signal-to-signal interval by programming digital counters to produce the timing signals at predetermined counts of a clock. Tapped delay lines have also been used to additionally delay the signals relative to the start of the timing sequence, although the timing signal interval resolution in such systems has been limited by the clock resolution. One solution to this limitation is disclosed in U.S. Pat. No. 4,231,104 to St. Clair, entitled "Generating Timing Signals". This system uses a programmable counter in combination with a tapped delay line to produce a chain of pulses which are asynchronous with, i.e., not an integer multiple of, the clock period, wherein the pulse duration and spacing is programmable with a resolution higher than that of the basic clock. The accuracy of such systems, however, is dependent upon the accuracy of the tapped delay lines used therein. The maximum resolution in such systems is generally limited by the required time delay range of the delay line. That is, a higher resolution delay line would have a correspondingly smaller time delay range, or range of settings at which the timing signal period can be set. Further, depending upon the number of delay line taps it may be difficult to obtain certain timing signal period settings. One way to alleviate these shortcomings is to use a higher frequency clock, e.g., a clock having a frequency of at least 500 MHz. However, counters suitable for use at such clock frequencies are complex and costly to fabricate. In addition, the distribution of such a high frequency clock signal throughout a timing system would require a high bandwidth transmission medium.

SUMMARY OF THE INVENTION

Accordingly, the present invention overcomes many of the disadvantages of prior art systems by providing a programmable, high resolution timing system including a selectable modulus prescaler counter.

In one embodiment of the present invention a high frequency clock is coupled to a prescaler counter which provides an output signal every predetermined number of clock pulses. The prescaler is coupled in turn to a period counter which provides a period signal after a predetermined number of prescaler output signal pulses. The prescaler and period counter are coupled to a memory which stores data corresponding to the selected modulus of the prescaler and the number of counts by which the period counter output signal is to be delayed. The period resolution of the present timing system is substantially equal to that of the high frequency clock by varying the prescaler modulus at programmable intervals. According to another aspect of the present invention the delay line time delay range of a delay generator coupled to the period counter is reduced by including a programmable delay counter therein and including a prescaler having a second clocking signal output. Yet another aspect of the present invention is embodied in a timing system including a single stage, high resolution surface acoustic wave oscillator to provide high frequency clock signals.

It is therefore an object of the present invention to provide an accurate, stable, high resolution timing sytem for producing timing signals at programmable intervals.

Another object of the present invention is to provide a programmable, high resolution timing system including a delay generator having a minimum delay line time delay range.

Yet another object of the present invention is to provide a timing system including high frequency surface acoustic wave means for generating clock signals.

BRIEF DESCRIPTION OF THE DRAWINGS

Other objects, advantages, and novel features of the invention will become apparent from the following detailed description of the invention when considered in conjunciton with the accompanying drawings wherein.

DETAILED DESCRIPTION OF THE PREFERRED EMBODIMENT

Figure 1:
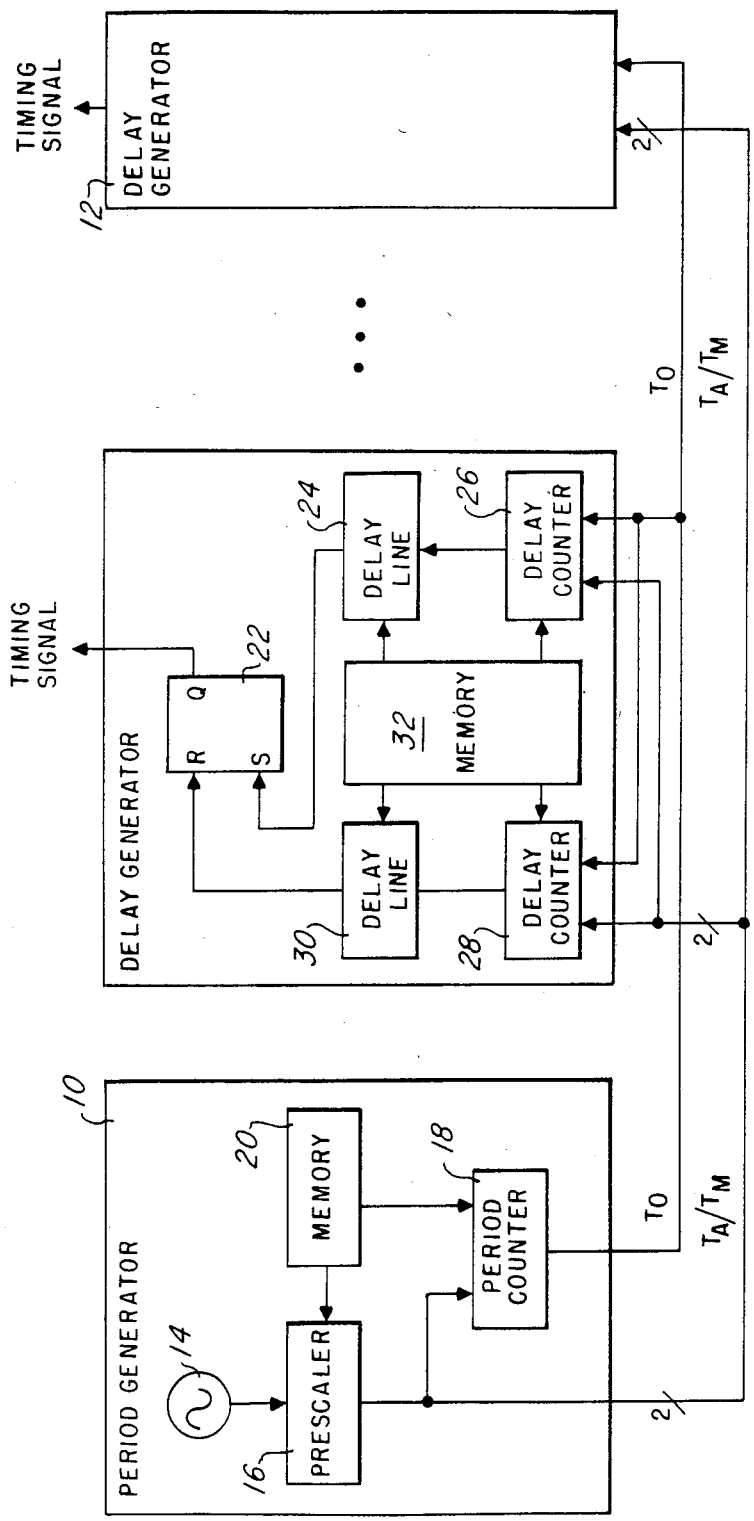
FIG. 1 is a block diagram of a timing system according to one embodiment of the present invention.

Referring now to the drawings, there is shown in FIG. 1 a timing system according to one embodiment of the present invention wherein a period generator 10 is coupled to one or more delay generators 12. Period generator 10 includes a clock 14 coupled to a prescaler or variable modulus counter 16, the operation of which will be explained in more detail below. Prescaler 16 produces output signals $T_A$ and $T_M$ which are two of the outputs from period generator 10. $T_A$ is also coupled to a period counter 18 whose output $T_o$ is also an output of period generator 10. Prescaler 16 and period counter 18 are also coupled to a data register or memory 20 which stores the desired counts which will be decremented by period counter 18, and the modulus of prescaler 18, during each timing period. The contents of memory 20 are updated by a data processor (not shown) depending upon the desired outputs from the timing system.

Figure 2:
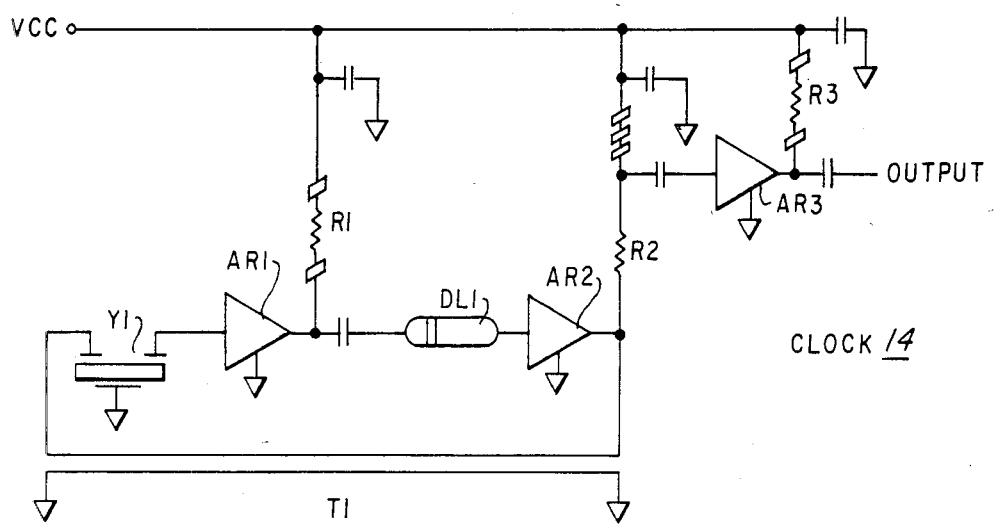
FIG. 2 is a schematic diagram of a high frequency clock employed in the timing system of FIG. 1.

Clock 14 is preferably a single stage, stable, accurate high frequency oscillator, for example, a surface acoustic wave (SAW) resonator. The theory and operation of SAW resonators are described, for example, in the following articles which are incorporated herein by reference: T. Shoquist, "Sink Your Teeth Into A SAW", *Electronic Products Magazine*, May 1979, pp. 63–66; and R.J. Murray et al., "SAW Components Answer Today's Signal Processing Needs", Electronics, Sept. 8, 1981, pp. 120–124. Referring to FIG. 2, there is shown a SAW oscillator suitable for use with the present timing system using a 537 MHz clock. SAW resonator Y1 and two wideband amplifiers AR1 and AR2 are connected to produce a positive feedback at the resonant frequency of Y1 ($2^{29}$ Hz.). A quarter wavelength transformer T1 reduces the gain requirements of AR1 and AR2 by matching the output impedance of AR2 to the input impedance of Y1. A delay line DL1, for example, a length of 50 ohm microstrip line, insures a full 360 degree phase shift around the oscillator loop. The high frequency AC signal from AR2 is coupled through a resistor R2 to a buffer amplifier AR3, the output of which is the output of clock 14.

Each delay generator 12, referring again to FIG. 1, includes a set delay portion and a reset delay portion coupled to the set and reset inputs, S and R, of a flip-flop 22, the output of which is the timing signal output of the respective delay generator 12. The set portion of delay generator 12 is formed of a delay counter 26 coupled to a tapped delay line 24 or other analog delay means, whose output is coupled to the S input of flip-flop 22. Similarly, the reset portion is formed of a delay counter 28 connected in coupling sequence to a tapped delay line 30 and the R input of flip-flop 22. Delay counters 26, 28 and delay lines 24, 30 are further coupled to a data register or memory 32 which stores the set and reset counts that determine the length of the timing signal pulse output from delay generator 12. Flip-flop 22 is set, and a timing pulse starts, a predetermined delay after the occurrence of a $T_o$ pulse, the delay corresponding to the count stored in counter 26 and the selected tap of delay line 24. The timing pulse ends by the resetting of flip-flop 22, which occurs after counter 28 had counted down and the delay introduced by delay line 30 has elapsed. Delay counters 26, 28 may be characterized as a "coarse" adjustment of the timing pulse duratin while delay lines 24, 30 operate as a "fine" adjustment, thereby permitting a high resolution setting with only a minimum of analog delay.

Figure 3:
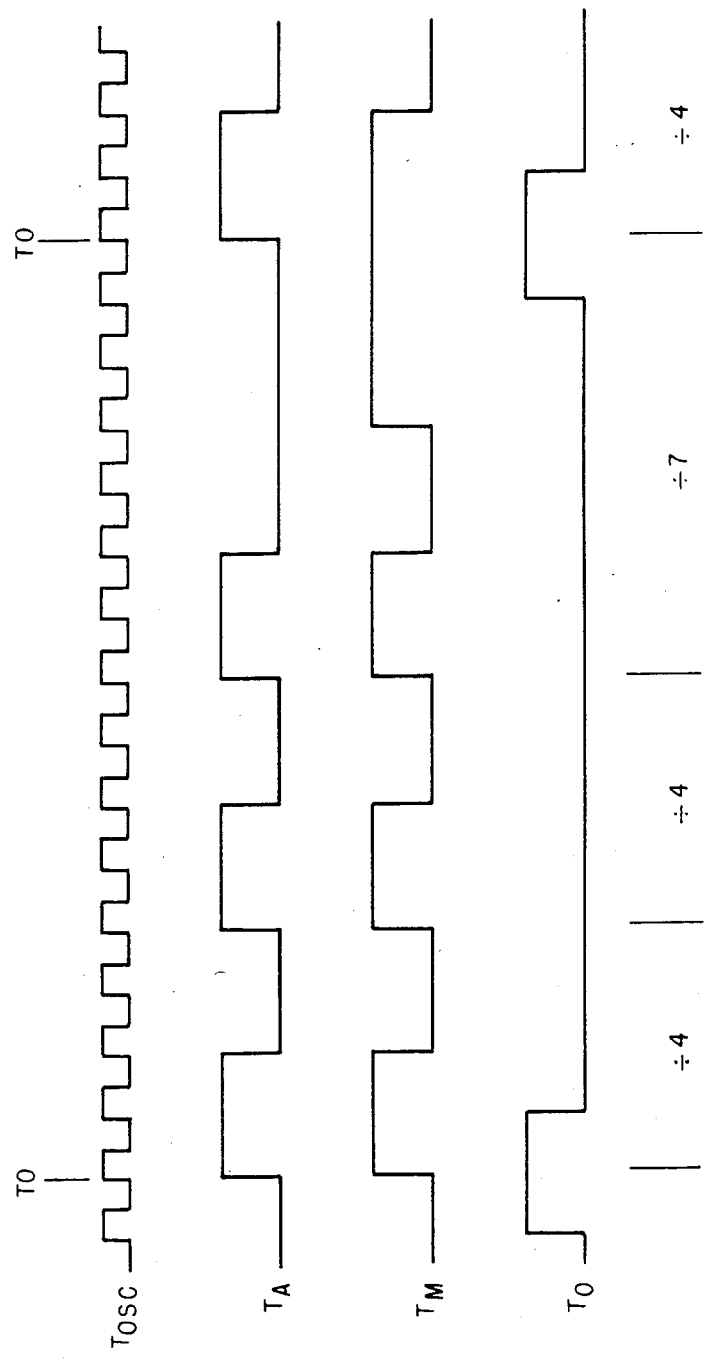
FIG. 3 is a timing diagram showing the signals at various points in the timing system of FIG. 1.

The operation of period generator 10 will now be described in detail by reference to FIG. 3, which is a timing diagram showing the relationship of the various signals therein. By way of example, it will be assumed that the signals from clock 14 have a frequency of $2^{29}$ Hz., or approximately 537 MHz., which corresponds to a period of about 1.86 ns. Prescaler 16 counts the clock pulses and provides an output $T_A$ every predetermined number of pulses as determined by the data stored in memory 20. Period counter 18, in turn, counts the $T_A$ pulses and provides an output $T_o$ every predetermined number of counts. Prescaler 16 and counter 18 together form a two section high resolution counter which is less complex than a single 537 MHz. counter. In one embodiment prescaler 16 is initially programmed by memory 20 as a modulo four counter, i.e., $T_A$ occurs every four clock pulses or every 7.45 ns. Counter 18 further divides the $T_A$ signals by counting a predetermined number of pulses. For example, if counter 18 is programmed to provide an output after six $T_A$ pulses, an output $T_o$ will be generated after approximately 45 ns, i.e., the effective frequency of $T_o$ is about 22 MHz. If period counter 18 is a 13-bit counter, then $T_o$ may be delayed any one of up to $2^{13}$ or 8192 $T_A$ counts, each 7.45 ns apart.

Period pulses are provided in the 7.45 ns intervals between synchronous $T_o$ pulses by varying the modulus of prescaler 16. For example, if the modulus of prescaler 16 is switched from four to five, the next $T_A$ pulse will be delayed one additional clock 14 count, i.e., and additional 1.86 ns. Similarly, if the modulus is switched to six from four, $T_A$ is delayed an additional 3.72 ns, and 5.58 ns when the modulus is switched from four to seven. Thus, by varying the modulus of prescaler 16 the resolution of the interval between $T_o$ pulses is increased, in this example, from 7.45 ns to 1.86 ns. FIG. 3 shows three modulo four intervals followed by a modulo seven interval. That is, the fourth $T_A$ pulse is delayed an additional three $T_{osc}$ cycles, or 5.58 ns. It is to be understood that the specific frequencies and counter moduli in the above-described embodiment are by way of example only and are not intended to limit the scope of the invention thereto.

Figure 4:
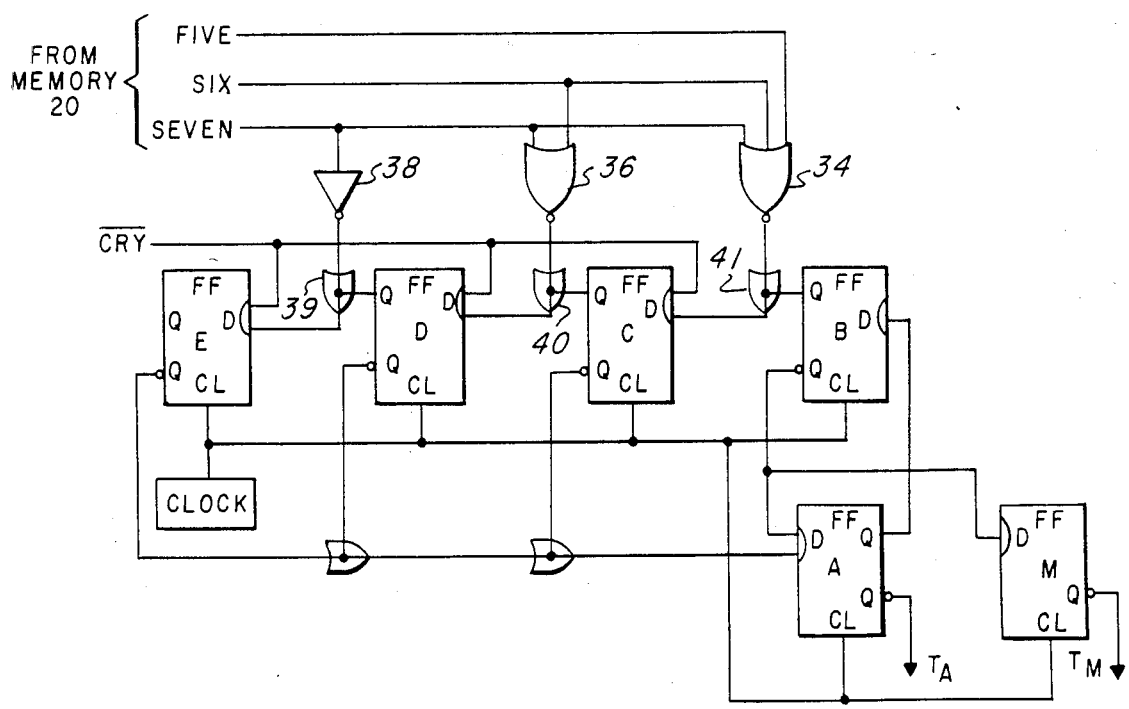
FIG. 4 is a schematic diagram of one embodiment of a prescaler circuit included in the present timing system.

Referring now to FIG. 4, there is shown one embodiment of prescaler 16 formed of a first set of logic gates, including six dual input D-type flip-flop circuits A–E and M, a second set of logic gates includes NOR gates 34 and 36, and inverter 38, first set of logic gates, including wired OR gates 39, 40, and 41. The OR gates 39, 40, and 41 are enabled by the modulus select signals, and are coupled to enabling inputs of the D-type flip-flops so that the output signals from the D-type flip-flops are delayed by a number of clock signal counts equal to a selected modulus. Flip-flops A–E are connected to function as a multi-stage counter, the number of stages depending upon which of the modulus select lines FIVE, SIX or SEVEN is enabled. When all select lines are low, i.e., a logic zero, flip-flops C, D and E are disabled and flip-flops A and B function as a two stage (count by four) counter. At the end of each period interval, signal $\overline{CRY}$, coupled to the second D-inputs of flip-flops C, D and E, goes low which permits prescaler 16 to count by four, five, six or seven. For example, if modulus select line FIVE is high, i.e., a logic one, the output of NOR gate 34 goes low and flip-flop C is enabled. With flip-flop C in the counting path the $T_A$ output is delayed one clock 14 count, or 1.86 ns. If select line SIX is high when $\overline{CRY}$ goes low, the outputs of both NOR gates 34 and 36 go low enabling flip-flops C AND D which in turn delays $T_A$ two clock counts. Finally, if modulo seven is selected by enabling select line SEVEN, the outputs of NOR gates 34, 36 and the inverter 38 go low, enabling flip-flops C, D and E and delaying $T_A$ by three clock counts. Prescaler output $T_M$ is provided by flip-flop M, which is derived from the $T_A$ signal by delaying the inverted $T_A$ output by two cycles of clock 14. The $T_M$ signal is used to provide a positive-going pulse to delay generators 12 during the interval that signal $T_A$ is delayed. This reduces the time delay range requirements of analog delay lines 24 and 30. In general, the delay line range requirement, $T_d$, is expressed by the equation $$T_d = M_{max} \times T_{osc}$$

where $T_{osc}$ is the period of clock 14 and $M_{max}$ is the maximum modulus of prescaler 16. In the described embodiment $M_{max}=7$ and $T_{osc}=1.86$ ns. Thus, if only $T_A$ were used to clock delay generator 12, $$T_d = (7)(1.86) = 13.02 \text{ ns}$$

By modifying delay counters 26, 28 to run on either $T_A$ or $T_M$, $T_d$ is reduced to four $T_{osc}$ periods, or 7.45 ns. Therefore, by using two lower frequency delay generator clocking signals the required analog time delay range is reduced by about 40 percent, which correspondingly improves delay line resolution and accuracy.

One means of selecting the modulus of prescaler 16 is to decode the two least significant bits of a 15 bit code stored in memory 20. The 13 most significant bits are then used to select the count of period counter 18 as described above. It will be apparent that the interval between sucessive $T_o$ pulses may be selected merely by loading an appropriate code into memory 20.

The present invention thus provides a timing system including a programmable period generator having the resolution capability of a high frequency clock while using lower frequency period and delay counters. A further aspect of the present invention is the use of a SAW resonator as a single stage high frequency oscillator in a high resolution, programmable timing system. Yet another aspect of the present invention is embodied in a programmable timing system including delay generators having a minimum analog delay line time delay range.

Obviously, many modifications and variations of the present invention are possible in view of the above teachings. It is therefore to be understood that within the scope of the appended claims the invention may be practiced otherwise than as specifically described herein.

What is claimed is:

1. A timing system comprising:
   a clock for generating clock signals;
   first counting means connected to receive and count said clock signals for providing first output signals at predetermined counts, comprising a first set of logic gates each clocked by said clock signals and wherein a modulus of said first counting means corresponds to which gates are enabled;
   means connected to said first counting means for varying the modulus of said first counting means comprising, a second set of logic gates, each gate in said second set being coupled to an enabling input of one of said first set of logic gates, wherein each gate in said second set is enabled by one or more modulus select signals so that said first output signals are delayed by a number of clock signal counts equal to a selected modulus;
   second counting means connected to receive said first output signals for counting said first output signals and providing second output signals at predetermined counts; and
   at least one programmable delay means each connected to the outputs of said first and second counting means for providing a timing signal of a preselected duration upon the occurrence of each of said first and second output signals.

2. The timing system of claim 1, wherein each of said delay means is further coupled to a second output from said first counting means.

3. The timing system of claim 1, wherein said clock comprises surface acoustic wave resonator means.

* * * * *